United States Patent [19]
Gatherer et al.

[11] Patent Number: 6,154,497
[45] Date of Patent: Nov. 28, 2000

[54] METHOD AND SYSTEM FOR ANALOG TO DIGITAL CONVERSION

[75] Inventors: Alan Gatherer, Richardson; John W. Fattaruso, Dallas, both of Tex.

[73] Assignee: Texas Instruments Incorporated, Dallas, Tex.

[21] Appl. No.: 08/992,553

[22] Filed: Dec. 17, 1997

[51] Int. Cl.$^7$ .................................................. H04B 14/06
[52] U.S. Cl. .......................... 375/247; 375/355; 375/363; 375/371; 327/146; 327/152; 327/153; 327/161
[58] Field of Search ..................................... 375/326, 355, 375/363, 247, 316, 324, 340, 371; 341/77, 143; 327/152, 153, 161, 144, 141, 146, 155, 261; 348/371, 372; 329/313

[56] References Cited

U.S. PATENT DOCUMENTS

| | | | |
|---|---|---|---|
| 5,309,484 | 5/1994 | McLane et al. | 375/106 |
| 5,388,127 | 2/1995 | Scarpa | 375/120 |
| 5,588,025 | 12/1996 | Strolle et al. | 375/316 |
| 5,784,601 | 7/1998 | Kisaichi | 395/559 |
| 5,790,061 | 8/1998 | Norimatsu | 341/139 |
| 5,793,818 | 8/1998 | Claydon et al. | 375/326 |
| 5,936,561 | 8/1999 | Lee | 341/143 |
| 5,959,562 | 9/1999 | Wiesbauer | 341/143 |

OTHER PUBLICATIONS

"Splitting the Unit Delay," *IEEE Signal Processing Magazine*, Jan. 1996, pp. 30–60.
"Clock Synchronizers," *Phaselock Techniques*, Floyd M. Gardner, Ph.D., John Wiley & Sons, 1979, pp. 231–249.
"Passband Timing Recovery in an All–Digital Modem Receiver," *IEEE Transactions on Communications*, vol. Com–26, No. 5, May 1978, pp. 517–523.

*Primary Examiner*—Stephen Chin
*Assistant Examiner*—Dac V. Ha
*Attorney, Agent, or Firm*—Dwight N. Holmbo; Wade James Brady III; Frederick J. Telecky, Jr.

[57] ABSTRACT

A conversion (20, 120, 220) system for converting an analog signal (18, 118, 218) to a digital signal (54, 154, 254) in a communications system (10), the conversion system (20, 120, 220) including an oversampled analog-to-digital converter modulator (24, 124, 224) for receiving an oversampling-clock signal (29, 129, 229) and a transmitted analog signal (18, 118, 218), the oversampled analog-to-digital converter modulator (24, 124, 224) operable to sample the analog signal (18, 118, 218) and to convert the analog signal (18, 118, 218) to a first digital signal (32, 132, 232), a time adjustor (41, 141, 241) coupled to the oversampled analog-to-digital converter modulator (24, 124, 224) for receiving the first digital signal (32, 132, 232) and a first adjustment signal (48, 148, 248), and for producing an output digital signal (54, 154, 254), and a digital signal processor unit (56, 156, 256) coupled to the time adjustor (41, 141, 241) for receiving the output digital signal (54, 154, 254) and performing timing recovery thereon to determine if any adjustment of the time adjustor (41, 141, 241) is required to minimize phase error and frequency error, and for producing the first adjustment signal (48, 148, 248) based on the results of the timing recovery. One time adjustor (41) includes a programmable delay line (46). Another time adjustor (141, 241) includes a two-part decimation filter (126, 226), a clock control (133, 233), and a clock divider (162, 262). An interpolation filter (270) may also be used as an aspect of the time adjustor (241). A method of converting an analog signal (18, 118, 218) to a digital signal (54, 154, 254) is also presented.

21 Claims, 2 Drawing Sheets

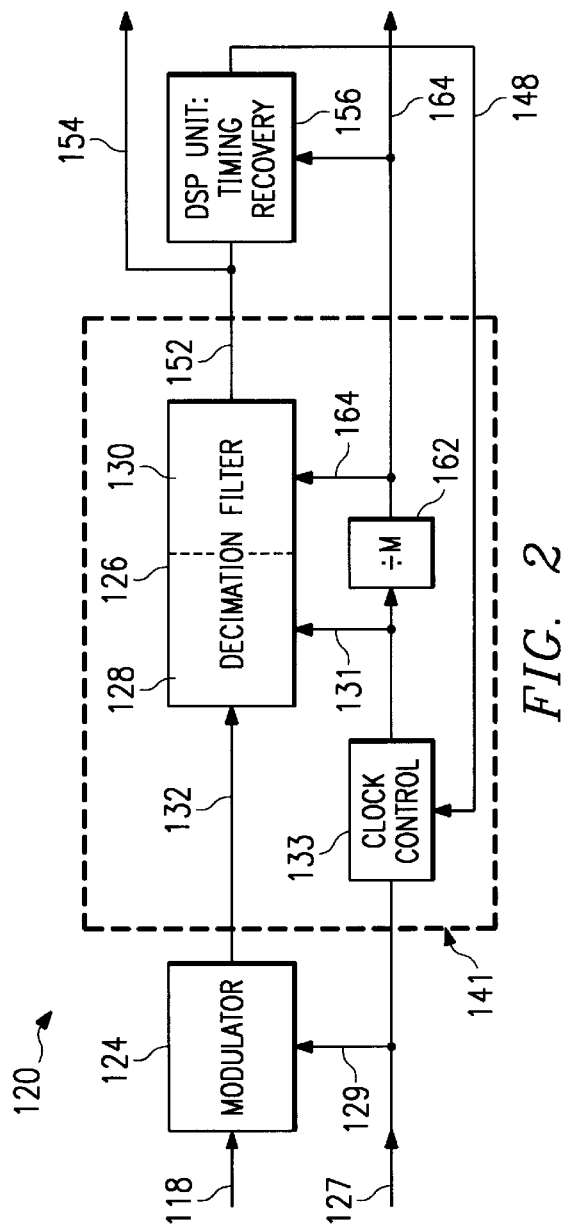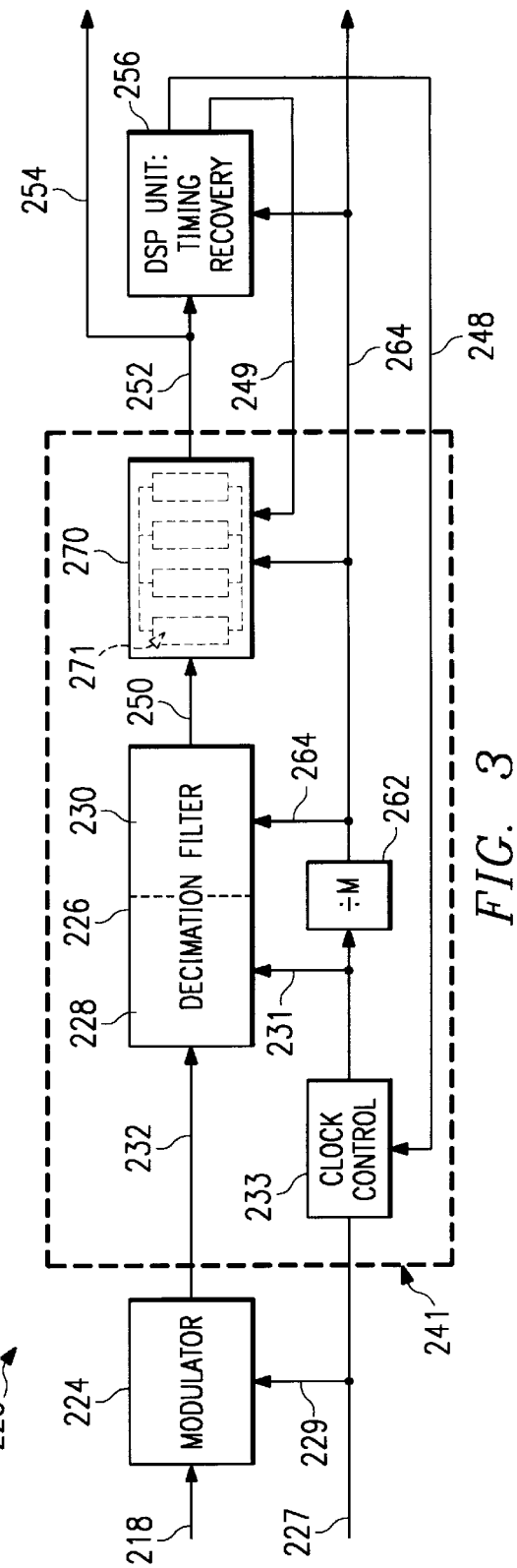

METHOD AND SYSTEM FOR ANALOG TO DIGITAL CONVERSION

TECHNICAL FIELD OF THE INVENTION

This invention relates generally to the field of digital signal processing, and more particularly to a method and circuit for analog to digital conversion.

BACKGROUND OF THE INVENTION

In any digital communications system there are transmitters and receivers that are physically separated and communicate over a medium such as a wire or air. The digital communication systems may transmit data such as a Quadrature Amplitude Modulated (QAM) or Quadrature Phase Shift Keying (QPSK) signals that represent a bitstream, which includes a series of symbols formed from a number of bits. To recover the data, the receiver will convert the analog signal received into a digital signal and will distinguish the symbols in the bitstream. In properly handling the incoming signal, the timing of sampling (or symbol timing) should be properly addressed.

A receiver will typically have a reference clock for timing that is only nominally at the same frequency and phase as the transmitter clock. In order to receive the data correctly, the data should be sampled at or near the same rate as the transmitter clock. To this end, the receiver must synchronize its clock with that of the transmitter. This is called "timing recovery." The larger the number of bits per hertz of bandwidth being transmitted, the higher is the system signal-to-noise ratio (SNR) requirement and the more accurate the timing recovery requirements. There are a number of techniques that may be used for timing recovery.

One timing-recovery approach is to use a mixed analog/digital loop. In this approach, an oversampled analog-to-digital converter (ADC) samples the incoming analog signal and communicates it to a digital signal processor (DSP). The digital signal processor may process the digital signal with a timing recovery algorithm to generate an adjustment signal. The adjustment signal is provided to a digital-to-analog converter (DAC), which provides an appropriate analog signal to a voltage-controlled oscillator (VCO) to adjust the timing or clock signal for the ADC. The performance of the DAC/VCO approach depends largely on the accuracy of the VCO which can degrade over time. The mixed analog/digital feedback may also be inconvenient. See generally, U.S. Pat. No. 5,388,127, entitled "Timing Recovery Circuit," which is incorporated herein by reference for all purposes.

Numerous time recovery algorithms are known in the art for use as a timing recovery algorithm in such a design. See, Floyd M. Gardner, "Phaselock Techniques," (1979). For example, a technique know as band-edge component maximization (BECM) may used. The BECM approach is described in Dominique N. Godard, "Passband Timing Recovery In An All-Digital Modem Receiver," IEEE Trans. Communications, Vol. Com-26, No. 5, May 1978, pp. 517–523. The timing extraction taught in the Godard article allows quick sampling phase acquisition and is readily implemented with a DSP.

Another approach to timing recovery has involved implementing interpolating filters in an all-digital timing recovery system. In this approach, the signal is sampled by an ADC at a constant rate and then digitally interpolated with a filter. The resultant digital signal may be processed with a time recovery algorithm in a DSP much as before, but the timing adjustment is made at the interpolation filter, rather than at the oscillator. This approach may eliminate potential errors due to drift and initial inaccuracies in the oscillator. Because the signal from the ADC is bandlimited and has been sampled above the nyquist rate, accurate interpolation of the value of any point located between two sampled points is possible, i.e., in essence this method reconstructs the continuous bandlimited signal and resamples it.

The interpolator is a filter. It can be a number of different filter types or combinations of filters, but typically its sin (x/x) ("sinc") filter. The filter will approximate the values between actual samples, and the complexity of the filter will vary directly with the desired accuracy. The more accuracy desired, the more taps required. Usually the interpolation will involve numerous multiplies. A large interpolation filter may be required, and if so, may consume considerable power, increase the complexity of the circuit, and require many millions of instructions per second (MIPS) be processed.

Though accurate resampling with the interpolator approach is possible, it typically requires a significant amount of filtering, which poses its own drawbacks such as adding considerable complexity to the circuit. In this regard, a number of the approaches to interpolation are known in the art and many are taught in a recent article. Timo I. Laakso, Vesa Valimaki, Matti Karjalainen, and Unto K. Laine, *Splitting The Unit Delay*, IEEE Signal Processing, pp. 30–60, January 1996.

An approach that may be used with ADC-interpolation-filter approach is Farrow's method, which is summarized in the above-noted article. This approach involves a set of filters approximating a fractional delay, d, in the desired range and approximating each coefficient as a Pth-order polynomial of d:

$$h_d(n) = \sum_{m=0}^{P} c_m(n)d^m \quad n = 0, 1, 2, \ldots N \quad (1)$$

wherein $c_m(n)$ are real-valued approximating coefficients. Each coefficient is a function of the fractional delay, d. The transfer function of the filter can be detailed into the following:

$$H_d(z) = \sum_{n=0}^{N} h_d(n)z^{-n} = \sum_{n=0}^{N}\left[\sum_{m=0}^{P} c_m(n)d^m\right]z^{-n} \quad (2)$$

$$= \sum_{m=0}^{P}\left[\sum_{n=0}^{N} c_m(n)z^{-n}\right]d^m = \sum_{m=0}^{P} C_m(z)d^m$$

where $$C_m(z) = \sum_{n=0}^{N} c_m(n)z^{-n} \quad (3)$$

This presentation indicates the implementation of Farrow's method with parallel fixed filters with output taps weighted by an appropriate power of d.

SUMMARY OF THE INVENTION

In accordance with an aspect of the present invention, a system and method for analog to digital conversion in digital communications is provided that addresses shortcomings of prior techniques and systems. According to an aspect of the present invention, a conversion system for converting an analog signal to a digital signal in a communications system includes an oversampled analog-to-digital converter for receiving an oversampling-clock signal and a transmitted analog signal, the oversampled analog-to-digital converter operable to sample the analog signal and to convert the analog signal to a first digital signal; a time adjustor coupled to the oversampled analog-to-digital converter for receiving the first digital signal and a first adjustment signal, and for producing an output digital signal; and a digital signal processor unit coupled to the time adjustor for receiving the output digital signal and performing timing recovery thereon to determine if any adjustment of the time adjustor is required to minimize phase error and frequency error, and for producing the first adjustment signal based on the results of the timing recovery.

According to another aspect of the present invention, a time adjustor for use with a system for converting an analog signal to a digital signal includes a programmable delay line coupled to the analog-to-digital converter for receiving the first digital signal, introducing a desired delay interval, and outputting a first intermediate digital signal; and a decimation filter coupled to the programmable delay line for receiving the first intermediate digital signal and producing the output digital signal from the first intermediate digital signal with the output signal having more bits of precision than the first intermediate digital signal.

According to another aspect of the present invention, a time adjustor for use with a system for converting an analog signal to a digital signal includes a decimation filter coupled to the oversampled analog-to-digital converter for receiving the first digital signal and producing the output digital signal having more bits of precision, the decimation filter having a first portion and a second portion; a clock control coupled to the digital signal processing unit for receiving the first adjustment signal and producing a first clock signal, the clock control coupled to the first portion of the decimation filter for delivering the first clock signal thereto; a clock divider coupled to the clock control for receiving the first clock signal and dividing it by an oversampling factor to produce a second clock signal, the clock divider coupled to the second portion of the decimation filter for delivering the second clock signal thereto; and wherein the clock control and clock divider are operable to adjust the output digital signal in response to the first adjustment signal. According to a more detailed aspect of the present invention an interpolation filter may be used as part of the time adjustor.

According to another aspect of the present invention, a method of timing recovery includes the steps of receiving a transmitted analog signal, converting the analog signal to a first digital signal with an oversampling analog-to-digital converter, performing a time adjustment with a time adjustor on the first digital signal to produce an output digital signal having more bits of precision than the first digital signal and less timing error, performing timing recovery on the output digital signal and producing a first adjustment signal based on the results of the timing recovery, and modifying the time adjustor based on the first adjustment signal to minimize timing error.

A technical advantage of the present invention is that complicated interpolation filters are eliminated if desired, and in instances where such filters are desired, a fewer number of filters are required. Another technical advantage of the present invention is that the need for precision analog components, such as a VCO, to obtain attractive results are unnecessary.

BRIEF DESCRIPTION OF THE DRAWINGS

For a more complete understanding of the present invention, the objects and advantages thereof, reference is now made to the following descriptions taken in connection with the accompanying drawings in which:

FIG. 2 is a schematic of a system according to another embodiment of the invention; and FIG. 3 is a schematic of a system according to another embodiment of the present invention.

DETAILED DESCRIPTION OF THE INVENTION

Figure 1:
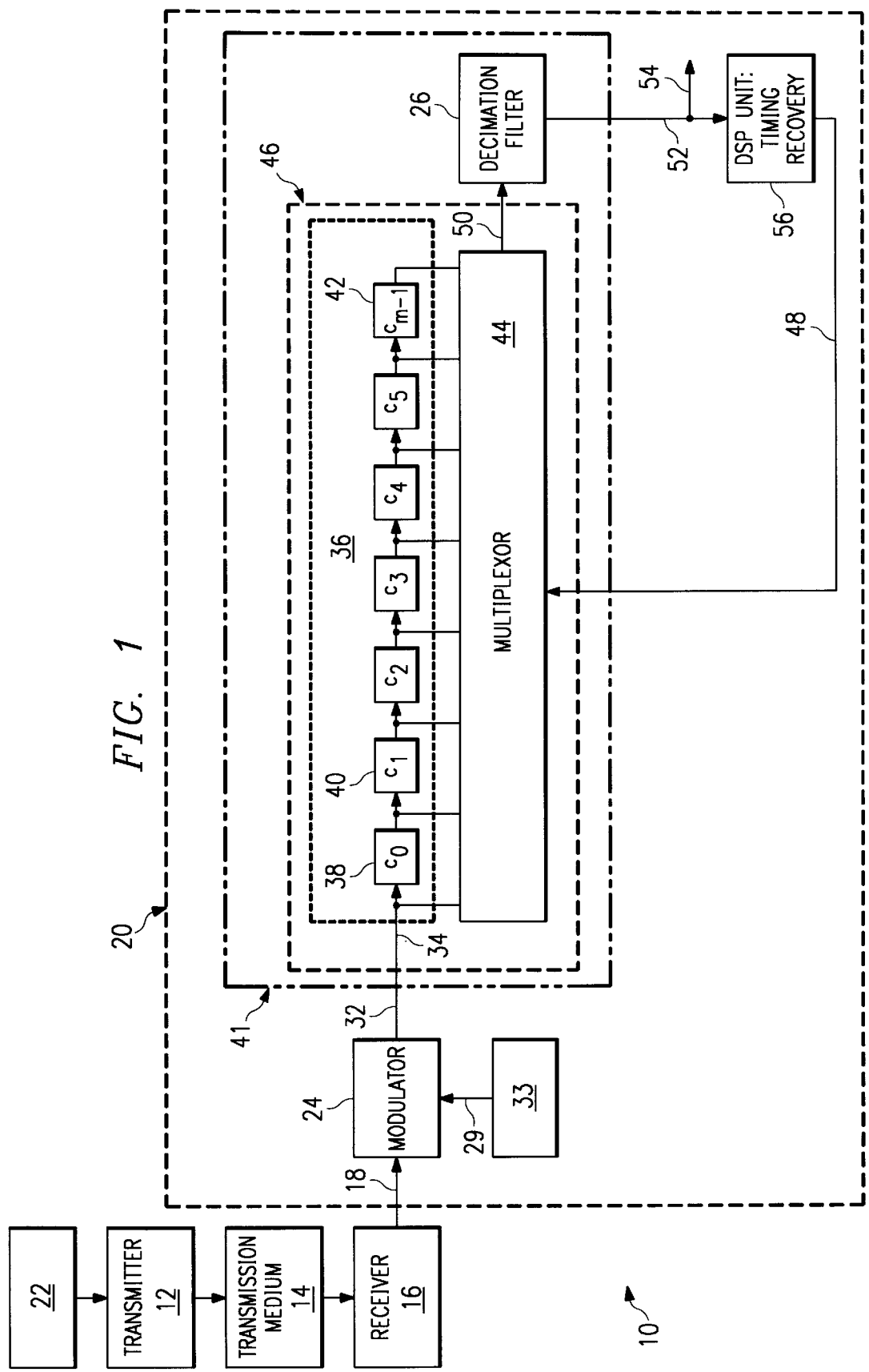
FIG. 1 is a schematic of a system according to one embodiment of the invention.

The preferred embodiment of the present invention and its advantages are best understood by referring to FIGS. 1 through 3 of the drawings, like numerals being used for like and corresponding parts of the various drawings.

Referring to FIG. 1, a digital communication system 10 includes a transmitter 12 for sending an analog signal over a transmission medium 14 to a receiver 16 that delivers the transmitted analog signal 18 to a conversion system 20. The transmitted analog signal will have distinct parameters such as a frequency and phase. Timing for the transmitter side of digital communication system 10 may be determined by a transmitter-side clock 22, which is associated with transmitter 12 and with the sending system. As will be described below, conversion system 20 converts the transmitted analog signal to a digital signal and in so doing recovers the timing of clock 22 with minimal timing error. Conversion system 20 includes an oversampled, analog-to-digital converter (ADC) modulator 24, a time adjustor 41, and a digital signal processor (DSP) unit 56.

The ADC modulator 24 may be a sigma-delta analog-to-digital converter such as those commercially available from Texas Instruments Incorporated of Dallas, Tex. with the product numbers TLC320AD56, TLC320AD50 or TLC320AD51. The ADC modulator 24 typically has an analog feedback that produces a chaotic output whose time average level follows analog input 18, but whose noise is substantially concentrated at high frequencies from where it may be removed by a subsequent low-pass filter, e.g., low-pass decimation filter 26. ADC modulator 24 receives an oversampling clock signal 29 from a first clock 33. ADC modulator 24 may be, for example, a one-bit analog-to-digital converter with oversampling of 64 or 128 times the ultimate sample rate required to modulate with the transmitted signal. While more precision is typically required with a digital communications system such as system 10, the additional precision may be obtained by use of a decimation filter 26. The oversampled analog-to-digital converter may sample the analog input signal or transmitted analog signal 18 at a rate M times the desired sampling rate (e.g., the Nyquist rate) with relatively low resolution, e.g., a single bit. M is referred to herein as the oversampling factor.

ADC modulator 24 is electrically coupled to time adjustor 41, and for the embodiment of FIG. 1, time adjustor 41 includes a programmable delay line 46 and a decimation filter 26. ADC modulator 24 receives the transmitted analog signal 18 and develops a first digital signal 32 which is delivered to programmable delay line 46. Programmable delay line 46 may include a plurality of delay elements 38–42 and an M-to-one multiplexor 44. The plurality 36 of delay elements 36–42 may be shift registers, storing M evenly spaced sampling phases of the first digital signal. Implementing a one-bit modulator provides an advantage of reducing the complexity of the plurality 36 of delay elements 38–42. Because the number of parallel bits generated by ADC modulator 24 is low, typically 1, the gate count of the delay shift registers 38–42 is also low. The plurality of delay elements 38–42 may run from a first delay element 38 to a second delay element 40 and on to a final delay element 42 as shown. M delay elements may be used in plurality 36 to provide a resolution of 1/M.

Multiplexor 44 is coupled to the outputs of the plurality 36 of delay elements 38–92. Multiplexor 44 receives a first adjustment signal 48 from an external control line coupled to DSP unit 56. First adjustment signal 48 is used to index one of the M evenly spaced sampling phases of delay elements 38–42. Multiplexor 44 delivers a second digital signal 50 having the selected delay to decimation filter 26.

Decimation filter 26 is electrically coupled to multiplexor 44 and receives second digital signal 50. Decimation filter 26 acts in many respects as a pulse density demodulator that deciphers and arrives at what is in essence a long time average of the signal delivered to it. Decimation filter 26 may then downsample the digital signal by M while increasing the resolution of the samples to obtain a desired digital signal. Decimation filter 26 downsamples and filters second digital signal 50 to produce a third digital signal 52 having more bits of precision than second digital signal 50. The SNR of the signal is thus improved. Third digital signal 52 is the output signal 54 of conversion system 20. Output signal 54 may be delivered to other systems and units to accomplish various tasks.

The third digital signal 52 is delivered to DSP unit 56. DSP unit 56 may be programmed to perform a timing recovery algorithm on third digital signal 52 in order to determine if an adjustment of the timing is necessary to minimize frequency and phase errors. This algorithm may be any of the number of timing recovery algorithms previously mentioned. One approach is to use the BECM approach, which has previously been discussed. If an adjustment is necessary, either to further delay the sampling location or to advance the sampling location, an appropriate signal is developed by DSP unit 56 in the form of first adjustment signal 48.

First adjustment signal 48 is a digital word that is delivered to multiplexor 44 to control the indexing of the plurality 36 of delay elements 38–42. If the timing algorithm of DSP unit 56 determines that sampling is occurring too early, signal 48 will increment multiplexor 44 to the next delay element in plurality 36, and if the sampling is occurring too late, signal 48 will instruct multiplexor to select an earlier delay element in plurality 36. In this way, multiplexor 44 indexes the sample timing of first digital signal 32 to improve the timing of the first digital signal compared to the timing of the transmitted analog signal. When the timing recovery has matched the received clock rate with the transmitter rate, the effective received frequency will be shifted by a continually incremented or decremented control word, periodically wrapping around plurality 36 of delay elements 38–42. Using this approach, conversion system 20 is able to recover the timing phase with an accuracy of 1/M of the sample.

Referring to FIG. 2, a conversion system 120 includes an ADC modulator 124, a time adjustor 141 and a DSP unit 156. In this embodiment, time adjustor 141 includes a decimation filter 126, a clock control 133, and a clock divider 162. Conversion system 120 receives a transmitted analog signal 118 that is delivered to ADC modulator 124.

Oversampling ADC modulator 124 receives transmitted analog signal 118 and a first clock signal 129, which is a set clock signal 127. Set clock signal 127 is delivered to clock control 133 and as first clock signal 129 to modulator 124 ADC first clock signal 129 is an oversampling clock signal for use by ADC modulator 124 to produce a first digital signal 132 oversampled by M.

Decimation filter 126 is electrically coupled to ADC modulator 124 and receives first digital signal 132. In this embodiment, the perceived sample timing of first digital signal 132, as observed by decimation filter 126, is the actual sample timing based on set clock signal 127 as adjusted by signals 131 and 164, rather than the indexed sample timing as shown in FIG. 1. As with the embodiment of FIG. 1, decimation filter 126 allows a relatively low resolution ADC modulator 124 to obtain additional precision, as well as providing a low pass filter.

Decimation filter 126 has a first portion 128 and a second portion 130. As will be described further below, first portion 128 is electrically coupled to clock control 133 and receives a first clock signal 131, which is at the oversampled rate (M times the desired sampling rate). The second portion 130 of decimation filter 126 receives a second clock signal 164, which is generated by clock divider 162. Signals 131 and 164 may be adjusted to help lock on the correct timing as will be described further below. Clock divider 162 divides signal 131 by a factor of M. Decimation filter 126 then downsamples and filters first digital signal 132, generating a second digital signal 152. Digital signal 152 is the output signal 154 of conversion system 120 and may continue on to other systems and units.

DSP unit 156 is electrically coupled to decimation filter 126 such that second digital signal 152 is delivered to DSP unit 156. DSP unit 156 is programmed to perform a timing recovery algorithm on second digital signal 152. Any number of timing recovery algorithms may be used with DSP unit 156 including the BECM approach. Through performing the timing recovery algorithm, DSP unit 156 will develop a first adjustment signal 148.

Clock control 133 is electrically coupled to DSP unit 156 such that first adjustment signal 148 is delivered to clock control 133. DSP unit 156, through first adjustment signal 148, exercises control on first clock signal 131 developed by clock control 133 to provide adjustments to the sample timing of decimation filter 126. In this embodiment, first adjustment signal 148 is used to directly modify the sample timing, rather than indexing the sample timing as in FIG. 1. For example, if sampling is occurring too early first adjustment, signal 148 will cause clock control 133 to skip a clock pulse, which will provide an adjustment of 1/M. If it is sampling too late, first adjustment signal 148 will instruct clock control 133 to duplicate clock pulses driving the decimation filter 126; this may be thought of as inserting an extra sample in the bit stream, thereby shifting the phase of clock signal 129 by one bit. This may be accomplished using any method suitable to produce an extra leading edge between pulses of first clock signal 131. One approach to accomplishing this is to double the frequency of first clock signal 131 before it reaches first portion 128 of decimation filter 126. This creates an extra clock pulse which may be used to resample the same piece of data that was just sampled, thus shifting the phase of the remaining samples by one bit.

Once the time lock is achieved by system 120, a periodic pattern of discarded clock pulses may affect realignment of the received signal frequency. Since the frequency trim of only 50 to 100 parts per million is typically needed in most practical timing recovery systems for analog-to-digital conversion in communication systems, the occurrence of the skip or duplicated bits will be quite infrequent.

As noted above, first clock signal 131 is divided by M to provide second clock signal 164. Second clock signal 164 is delivered to second portion 130 of decimation filter 126. Thus, when clock control 133 adjusts first clock signal 131, second clock signal 164 will also be modified slightly. Second clock signal 164 may be used with the rest of the circuit or systems to which output signal 154 is delivered. System 120 produces an output signal 154 but also clocks that output, i.e., delivers second clock signal 164.

If more precise timing than 1/M is desired, an interpolation filter may be added. For example, FIG. 3 shows an interpolation filter 270 that has been added to a time adjustor 241 of conversion system 220. Time adjustor 241 includes decimation filter 226, interpolation filter 270, clock control 233, and clock divider 262. Filter 270 may include one or more taps or subfilters 271. Subfilters 271 will allow weighting for interpolation by an interpolation method such as Farrow's Method as previously discussed.

Continuing to refer to FIG. 3, a transmitted analog signal 218 is delivered to an oversampled, sigma-delta analog-to-digital converter modulator 224. Oversampling ADC modulator 224 also receives a set clock signal 229 from a clock signal 227. Clock signal 227 is also delivered to clock control 233. ADC modulator 224 is coupled to decimation filter 226 having a first portion 228 and a second portion 230, such that a first digital signal 232, which is developed by ADC modulator 224 is delivered to decimation filter 226. First portion 228 of decimation filter 226 receives a first clock signal 231, and second portion 230 receives a second clock signal 264, which first clock signal 1231 divided by oversampling factor M in clock divider 262. Decimation filter 226 produces a second digital signal 250 which is then delivered to interpolation filter 270, which is electrically coupled to filter 226. Interpolation filter 270 includes a plurality of filters or taps 271 for approximating the signal value between actual sampling points to deliver a third digital signal 252, which is a more precisely adjusted digital signal. Third digital signal 252 is the output signal 254 of conversion system 220.

A DSP unit 256 with a timing recovery algorithm is electrically coupled to interpolation filter 270 such that third digital signal 252 is delivered to DSP unit 256. DSP unit 256 may use a number of timing recovery algorithms as previously described to determine appropriate adjustments to cause conversion system 220 to produce output signal 254 with minimized frequency and phase error. In this embodiment, DSP unit 256 develops both a first adjustment signal 248 and a second adjustment signal 249. First adjustment signal 248 is a coarse timing adjustment signal and second adjustment signal 249 is a fine tuning timing adjustment signal. Clock control 233 is electrically coupled to DSP unit 256 such that first adjustment signal 248 is delivered to clock control 233. First adjustment signal 248 instructs clock control 233 to adjust by the resolution of oversampling, 1/M as appropriate.

Interpolation filter 270 is electrically coupled to DSP unit 256 such that second adjustment signal 249 is delivered to interpolation filter 270. Second adjustment signal 249 is a fine or precise adjustment signal for interpolation filter 270. In this regard, interpolation filter 270 may utilize Farrow's method as previously described with taps 271 or a filter bank of delays. For Farrow's method, second adjustment signal 249 would provide a signal d between 0 and 1/M, where d is the delay. The d would be used by the Farrow system of filter 270 to weight the outputs of filters or taps 271. If second adjustment signal 249 is sent to a filter bank, signal 249 would tell which filter of the filter bank to use and implement.

System 220 allows more for precise timing over system 120 (FIG. 2) through the addition of interpolation filter 270. The use of Farrow's method with interpolation filter 270 is greatly reduced in complexity from previous applications of Farrow's method because of the already closely sampled signal, i.e., already within 1/M, interval. Thus, where a complex polynomial may have been required for an interpolation filter, a linear approximation may now be adequate, which will lower the complexity in its implementation. Thus, interpolation filter 270 may have a minimum number of taps 271.

Although the invention has been particularly shown and described by the foregoing detailed description, it will be understood by those skilled in the art that various other changes in form and detail may be made without departing from the spirit and scope of the invention, which is defined by the appended claims.

What is claimed is:

1. A conversion system for converting an analog signal to a digital signal in a communications system, the conversion system comprising:

an oversampled analog-to-digital converter modulator for receiving an oversampling-clock signal and a transmitted analog signal, the oversampled analog-to-digital converter modulator operable to sample the analog signal and to convert the analog signal to a first digital signal;

a time adjustor coupled to the oversampled analog-digital converter modulator for receiving the first digital signal and a first adjustment signal, and for producing an output digital signal;

a digital signal processor unit coupled to the time adjustor for receiving the output digital signal and performing timing recovery thereon to determine if any adjustment of the time adjustor is required to minimize phase error and frequency error, and for producing the first adjustment signal; and wherein the time adjustor comprises a programmable delay line coupled to the analog-to-digital converter modulator for receiving the first digital signal, introducing a desired delay interval, and producing a first intermediate digital signal, wherein the programmable delay line comprises:

a plurality of delay elements coupled to the oversampled analog-to-digital converter modulator for receiving the first digital signal and holding the first digital signal for different intervals; and a multiplexor coupled to the plurality of delay elements for selectively accessing one of the plurality of delay elements to obtain the first digital signal for a desired delay interval, and for producing the output digital signal.

2. The system of claim 1 wherein the time adjustor further comprises a decimation filter coupled to the programmable delay line for receiving the first intermediate digital signal and producing the output digital signal from the first intermediate digital with the output signal having more bits of precision than the first intermediate digital signal.

3. The system of claim 1, wherein the time adjustor further comprises:

a decimation filter for receiving the first intermediate digital signal and producing the output digital signal from the first intermediate digital signal having more bits of precision than the first intermediate digital signal.

4. The system of claim 1, wherein the digital signal processor unit is operable to perform a timing recovery algorithm using band-edge component maximization.

5. The system of claim 1, wherein the oversampled analog-to-digital converter comprises a one bit analog-to-digital converter for generating the first digital signal having one bit of precision.

6. The system of claim 1, wherein the digital signal processor is operable to perform timing recovery using band-edge component maximization.

7. The system of claim 1:
wherein the first adjustment signal is an instruction to the multiplexor to select a next delay element from the plurality of delay elements if the sampling is occurring too early and an instruction to the multiplexor to select an earlier delay from the plurality of delay elements if the sampling is occurring too late; and
wherein the multiplexor is operable to receive the first adjustment signal and to respond to the first adjustment signal by selecting an appropriate delay element of the plurality of delay elements.

8. The system of claim 7 wherein the time adjustor further comprises a decimation filter for receiving the first intermediate digital signal and producing the output digital signal from the first intermediate digital signal having more bits of precision than the first intermediate digital signal.

9. A conversion system for converting an analog signal to a digital signal in a communications system, the conversion system comprising:
an oversampled analog-to-digital converter modulator for receiving an oversampling-clock signal and a transmitted analog signal, the oversampled analog-to-digital converter modulator operable to sample the analog signal and to convert the analog signal to a first digital signal;
a time adjustor coupled to the oversampled analog-to-digital converter modulator for receiving the first digital signal and a first adjustment signal, and for producing an output digital signal; and
a digital signal processor unit coupled to the time adjustor for receiving the output digital signal and performing timing recovery thereon to determine if any adjustment of the time adjustor is required to minimize phase error and/frequency error, and for producing the first adjustment signal;
wherein the time adjustor comprises:
a decimation filter coupled to the oversampled analog-to-digital converter modulator for receiving the first digital signal and producing the output digital signal having more bits of precision, the decimation filter having a first portion and a second portion;
a clock control coupled to the digital signal processing unit for receiving the first adjustment signal and producing a first clock signal, the clock control coupled to the first portion of the decimation filter for delivering the first clock signal thereto;
a clock divider coupled to the clock control for receiving the first clock signal and dividing it by an oversampling factor to produce a second clock signal, the clock divider coupled to the second portion of the decimation filter for delivering the second clock signal thereto; and
wherein the clock control and clock divider are operable to adjust the output digital signal in response to the first adjustment signal.

10. The system of claim 9, wherein the first adjustment signal comprises:
an instruction to the clock control to skip a cycle in the first clock signal if the sampling is occurring too early; and
an instruction to generate a duplicate clock pulse in the first clock signal if the sampling is occurring too late.

11. A conversion system for converting an analog signal to a digital signal in a communications system, the conversion system comprising:
an oversampled analog-to-digital converter modulator for receiving an oversampling-clock signal and a transmitted analog signal, the oversampled analog-to-digital converter modulator operable to sample the analog signal and to convert the analog signal to a first digital signal;
a time adjustor coupled to the oversampled analog-to-digital converter modulator for receiving the first digital signal and a first adjustment signal, and for producing an output digital signal; and
a digital signal processor unit coupled to the time adjustor for receiving the output digital signal and performing timing recovery thereon to determine if any adjustment of the time adjustor is required to minimize phase error and frequency error, and for producing the first adjustment signal;
wherein the time adjustor comprises:
a decimation filter coupled to the oversampled analog-to-digital converter modulator for receiving the first digital signal and producing a first intermediate digital signal having more bits of precision, the decimation filter having a first portion and a second portion;
a clock control coupled to the digital signal processing unit for receiving the first adjustment signal and producing a first clock signal, the clock control coupled to the first portion of the decimation filter for delivering the first clock signal thereto;
a clock divider coupled to the clock control for receiving the first clock signal and dividing it by an oversampling factor to produce a second clock signal, the clock divider coupled to the second portion of the decimation filter for delivering the second clock signal thereto;
wherein the clock control and clock divider are operable to adjust the first intermediate digital signal in response to the first adjustment signal;
wherein the digital signal processor unit is further operable to produce a second adjustment signal for fine tuning timing; and
an interpolation filter coupled between the decimation filter and the digital signal processor unit for receiving the first intermediate digital signal from the decimation filter and for receiving the second adjustment signal from the digital signal processing unit, and operable to generate therefrom the output digital signal with the output digital signal more precisely adjusted than the second digital signal.

12. The system of claim 11, wherein the first adjustment signal comprises:
an instruction to the clock control to skip a cycle in the first clock signal if the sampling is occurring too early; and
an instruction to generate a duplicate clock pulse in the first clock signal if the sampling is occurring too late.

13. A conversion system for converting an analog signal to a digital signal in a communications system, the conversion system comprising:

an oversampled analog-digital converter modulator for receiving an oversampling-clock signal and a transmitted analog signal, the oversampled analog-to-digital converter modulator operable to sample the analog signal and to convert the analog signal to a first digital signal;

a decimation filter coupled to the oversampled analog-to-digital converter modulator for receiving the first digital signal and producing a second digital signal having more bits of precision, the decimation filter having a first portion and a second portion;

a clock control coupled to the oversampled analog-to-digital converter modulator for controlling sample timing of the oversampled analog-to-digital converter modulator;

a digital signal processing unit coupled to the decimation filter for receiving the second digital signal and performing a timing recovery algorithm thereon to determine if any adjustment of the clock control is required to minimize phase error and frequency error, and for producing a first adjustment signal based on the results of the timing recovery algorithm;

the clock control coupled to the digital signal processing unit for receiving the first adjustment signal and producing a first clock signal, the clock control coupled to the first portion of the decimation filter for delivering the first clock signal thereto;

a clock divider coupled to the clock control for receiving the first clock signal and dividing it by an oversampling factor to produce a second clock signal, the clock divider coupled to the second portion of the decimation filter for delivering the second clock signal thereto; and wherein the second digital signal is the output signal for the conversion system and;

an interpolation filter coupled between the decimation filter and the digital signal processor unit for receiving the second digital signal from the decimation filter and a second adjustment signal generated by the digital signal processing unit, the interpolation filter having a plurality of subfilters, the interpolation filter operable to generate a third digital signal using Farrow's method, the third digital signal being more precisely adjusted than the second digital signal and being the output signal for the conversion system.

14. The system of claim 13, wherein the oversampled analog-to-digital converter comprises a one bit analog-to-digital converter for generating the first digital signal having one bit of precision.

15. The system of claim 13, wherein the digital signal processor unit is operable to perform a timing recovery algorithm using band-edge component maximization.

16. The system of claim 13, wherein the first adjustment signal comprises:
an instruction to the clock control to skip a cycle in the first clock signal if the sampling is occurring too early; and
an instruction to generate a duplicate clock pulse in the first clock signal if the sampling is occurring too late.

17. A method of timing recovery comprising the steps of:
receiving a transmitted analog signal;
converting the analog signal to a first digital signal with an oversampling analog-to-digital converter modulator;
performing a time adjustment with a timing adjustor on the first digital signal to produce an output digital signal having more bits of precision than the first digital signal and less timing error;
performing timing recovery on the output digital signal and producing a first adjustment signal based on the results of the timing recovery; and
modifying the time adjustor based on the first adjustment signal to minimize timing error; and
wherein the step of performing a time adjustment comprises the steps of:
storing the first digital signal in a plurality of delay elements, wherein the plurality of delay elements are for receiving the first digital signal and holding the first digital signal for different intervals; and
selectively accessing one of the plurality of delay elements with a multiplexor coupled thereto and based on the first adjustment signal to obtain the first digital signal for a desired delay interval; and
filtering the first digital signal for the desired delay interval with a decimation filter to produce the output digital signal having more bits of precision than the first digital signal.

18. The method of 17 wherein the step of
selectively accessing the plurality of delay elements based on the first adjustment signal to obtain the first digital signal for a desired delay interval comprises selecting a next delay element if the sampling is occurring too early and selecting a previous delay element if the sampling is occurring too late.

19. A method of timing recovery comprising the steps of:
receiving a transmitted analog signal;
converting the analog signal to a first digital signal with an oversampling analog-to-digital converter modulator;
performing a time adjustment with a timing adjustor on the first digital signal to produce an output digital signal having more bits of precision than the first digital signal and less timing error;
performing timing recovery on the output digital signal and producing a first adjustment signal based on the results of the timing recovery;
modifying the time adjustor based on the first adjustment signal to minimize timing error;
wherein the step of performing a time adjustment comprises:
producing a first clock signal based on the first adjustment signal;
delivering the first clock signal to a first portion of a dedicator filter;
producing a second clock signal by dividing the first clock signal by an oversampling factor;
delivering the second clock signal to a second portion of the dedicator filter; and
skipping a cycle in the first clock signal if the sampling is occurring too early and generating a duplicate clock pulse in the first clock signal if the sampling is occurring too late, to produce the output signal.

20. The method of 19 wherein the step of performing a time adjustment further comprises the step of
interpolating the first intermediate digital signal based on a second adjustment signal to generate an output digital signal being more precisely adjusted than the first intermediate digital signal.

21. The method of 20
wherein the step of interpolating comprises the step of using a plurality of filters with Farrow's method to produce the output signal.

* * * * *

UNITED STATES PATENT AND TRADEMARK OFFICE
CERTIFICATE OF CORRECTION

PATENT NO.    : 6,154,497
DATED         : November 28, 2000
INVENTOR(S)   : Gatherer et al.

It is certified that error appears in the above-identified patent and that said Letters Patent is hereby corrected as shown below:

<u>Title page,</u>
Insert -- [60], Continuing Data, Provisional Application No. 60/033,861, Dec. 19, 1996 --

Signed and Sealed this

Eleventh Day of June, 2002

*Attest:*

*Attesting Officer*

JAMES E. ROGAN
*Director of the United States Patent and Trademark Office*